United States Patent [19]

Schwee

[11] Patent Number: 5,793,667
[45] Date of Patent: Aug. 11, 1998

[54] SENSE AMPLIFIER CONTROL SYSTEM FOR FERROELECTRIC MEMORIES

[75] Inventor: Leonard J. Schwee, Silver Spring, Md.

[73] Assignee: The United States of America as represented by the Secretary of the Navy, Washington, D.C.

[21] Appl. No.: 733,455

[22] Filed: Oct. 18, 1996

Related U.S. Application Data

[63] Continuation of Ser. No. 584,818, Sep. 19, 1990, abandoned.
[51] Int. Cl.$^6$ ................................................ G11C 11/22
[52] U.S. Cl. ................................................ 365/145; 365/203
[58] Field of Search ................................ 365/145, 203, 365/200, 189.05

[56] References Cited

U.S. PATENT DOCUMENTS

| | | | |
|---|---|---|---|
| 4,809,225 | 2/1989 | Dimmler et al. | 365/145 |
| 4,998,223 | 3/1991 | Akaogi | 365/200 |
| 5,068,831 | 11/1991 | Hoshi et al. | 365/203 |
| 5,111,386 | 5/1992 | Fujishima et al. | 365/189.05 |

*Primary Examiner*—A. Zarabian
*Attorney, Agent, or Firm*—John Forrest; Jacob Shuster

[57] ABSTRACT

Different sequences of pulses applied to three terminals of a sense amplifier section in timed relation to address pulses applied to a word line of a ferroelectric memory cell, controls detection and transfer of data with respect to a selected bit line to which the sense amplifier section is connected for rapid reset following data transfer without any precharge.

6 Claims, 3 Drawing Sheets

SENSE AMPLIFIER CONTROL SYSTEM FOR FERROELECTRIC MEMORIES

This application is a continuation of application Ser. No. 07/584,818 filed Sep. 19, 1990, abandoned.

BACKGROUND OF THE INVENTION

This invention relates generally to sense amplifiers for random access memories of the type disclosed in my prior copending applications, Ser. Nos. 54,973 and 489,138, respectively filed May 5, 1987 and Mar. 6, 1990, to which the present application is related.

The provision of sense amplifier circuits for a random access memory array to detect data stored therein and enable transfer of data in response to read and write request signals is already well known. The use of preamplifiers in such sense amplifier circuits for a dynamic type of random access memory (DRAM) involving cross-coupled charge transfer techniques, is disclosed for example in U.S. Pat. No. 4,039,861 to Heller et al. In such memory systems, the addressed bit lines must be precharged before data transfer begins to somewhat delay readout in response to read request signals. In view thereof, relatively complex circuitry involving pulse generation and control logic must be provided to establish proper timing and voltage levels.

It is therefore an important object of the present invention to provide in combination with a random access memory array an improved sense amplifier circuit of the type disclosed in the Heller et al. patent but which avoids precharging and is relatively faster in its data transfer operations.

An additional object of the invention in accordance with the foregoing object is to provide less complex control logic and pulse generating circuitry having a rapid memory reset capability.

SUMMARY OF THE INVENTION

In accordance with the present invention, preamplifiers with cross-coupled switching transistors are connected between selectively addressed data storing bit lines of a random access memory array and a reference source of charge voltage to perform read and write operations by transfer of charges greater in magnitude than the charges maintained on the bit lines between operations. The data storage condition of the bit lines between read/write operations is preserved by avoiding any precharge thereof and by use of non-volatile ferroelectric memory cells to which the bit lines are connected. Each preamplifier with associated logic controlled switching transistors forms a sense amplifier section through which each bit line, whether addressed or not, is detected and restored to a non-volatile data storing condition by reset in a rapid fashion following each read/write data transfer operation. Data transfer is performed with respect to each selectively addressed bit line under control of clocked input pulses in timed relation to address pulses applied to the word line through which such bit line is addressed. The clocked input pulses are applied in different sequences to three input terminals of each sense amplifier section, which is also provided with a data output terminal under control of a logic switch. Logic circuitry associated with the sense amplifier sections establish the different pulse sequences aforementioned in response to the data transfer request signals.

BRIEF DESCRIPTION OF THE DRAWING FIGURES

Other objects, advantages and novel features of the invention will become apparent from the following detailed description of the invention when considered in conjunction with the accompanying drawing wherein.

DETAILED DESCRIPTION OF PREFERRED EMBODIMENTS

Figure 1:
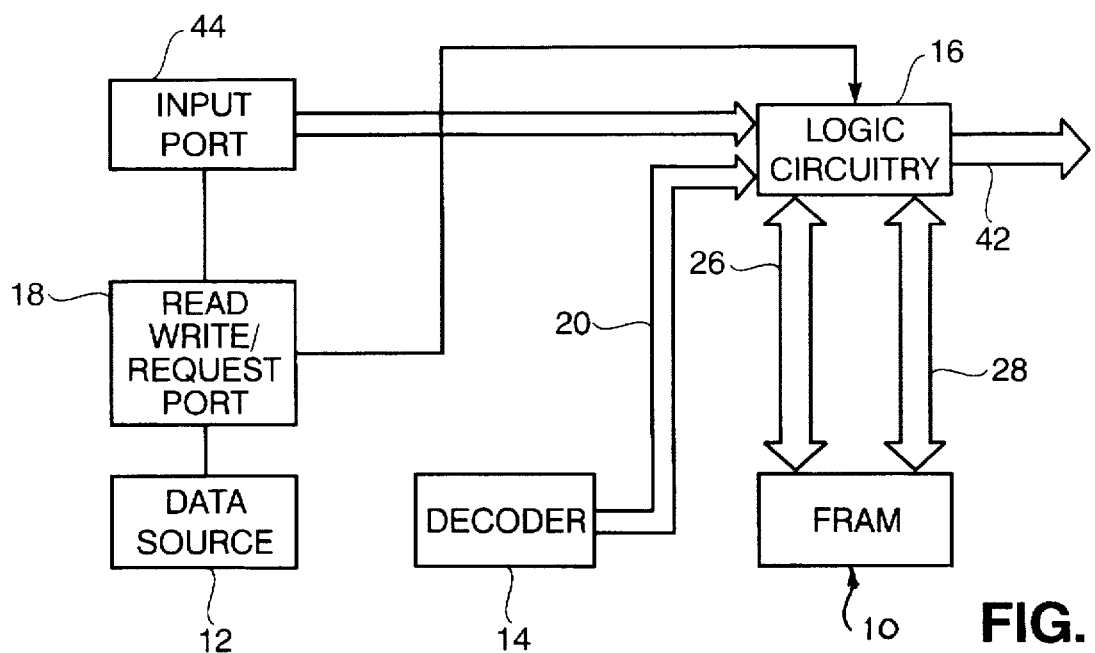
FIG. 1 is a schematic block diagram of a random access memory control system with which the present invention is associated.

FIG. 1 diagrams a ferroelectric random access memory (FRAM) 10 to which data is fed from some source 12 through a decoder 14. Associated with the memory array 10 and the data source 12 is logic circuitry 16 and a read/write request port 18. The data output of the decoder 14 is fed through a bus 20 to the memory array 10 and the logic circuitry 16 according to one embodiment of the invention in order to detect data stored in the memory array and to perform various data transfer functions.

Figure 2:
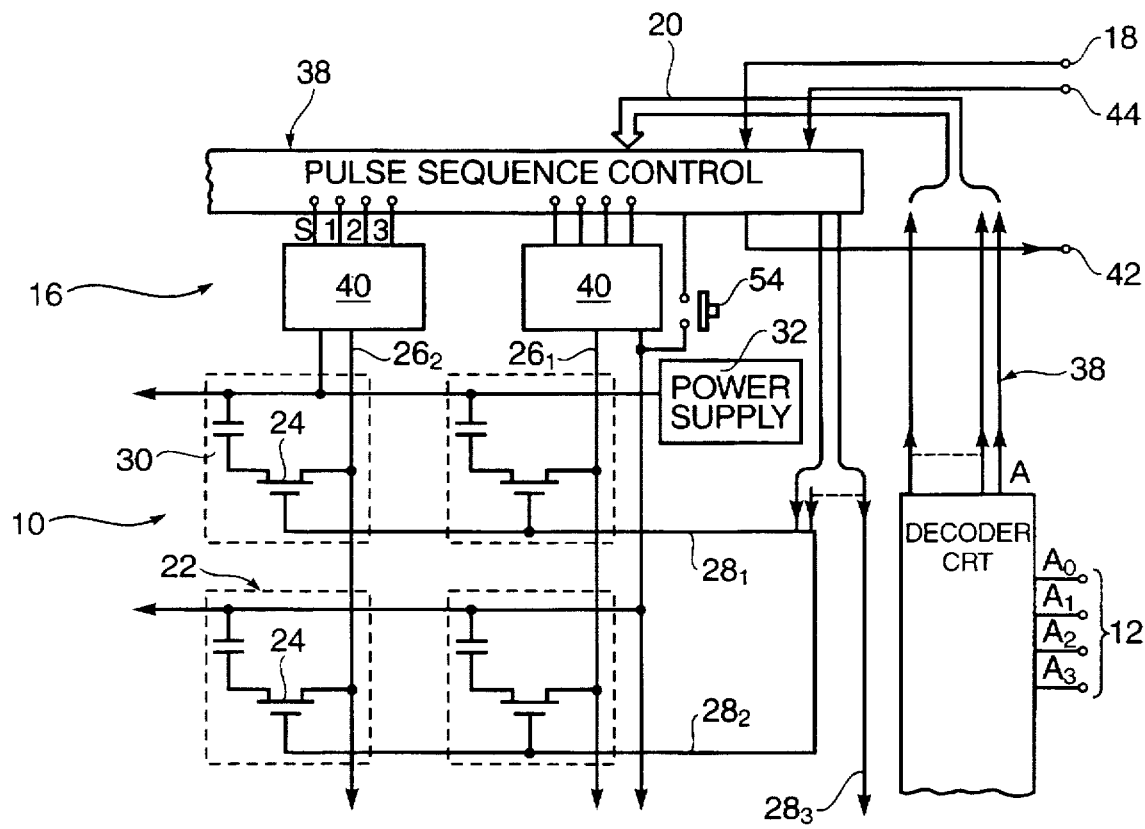
FIG. 2 is a more detailed circuit diagram of the memory array, decoder and logic circuit components of the system illustrated in FIG. 1.

As shown in greater detail in FIG. 2, the memory array 10 is composed of a plurality of interconnected, non-volatile memory cells 22. Such memory cells are disclosed in greater detail for example in my aforementioned copending applications. Thus, the memory cells 22 respectively include switching control transistors 24 of the MOSFET type having source and drain electrodes connected in parallel to the bit lines $26_1$, $26_2$, . . . respectively associated with those of the cells 22 aligned in columns. The control gate electrodes of the switching control transistors 24 are addressed through word lines $28_1$, $28_2$, . . . connected in parallel to those associated memory cells aligned in rows perpendicular to the aforementioned columns of aligned cells. Ferroelectric capacitors 30 in each of the memory cells have opposed electrode plates respectively connected to one of the source and drain capacitively couple the remaining electrodes of a transistor 24 and the power supply 32 of the memory array.

Figure 3A:
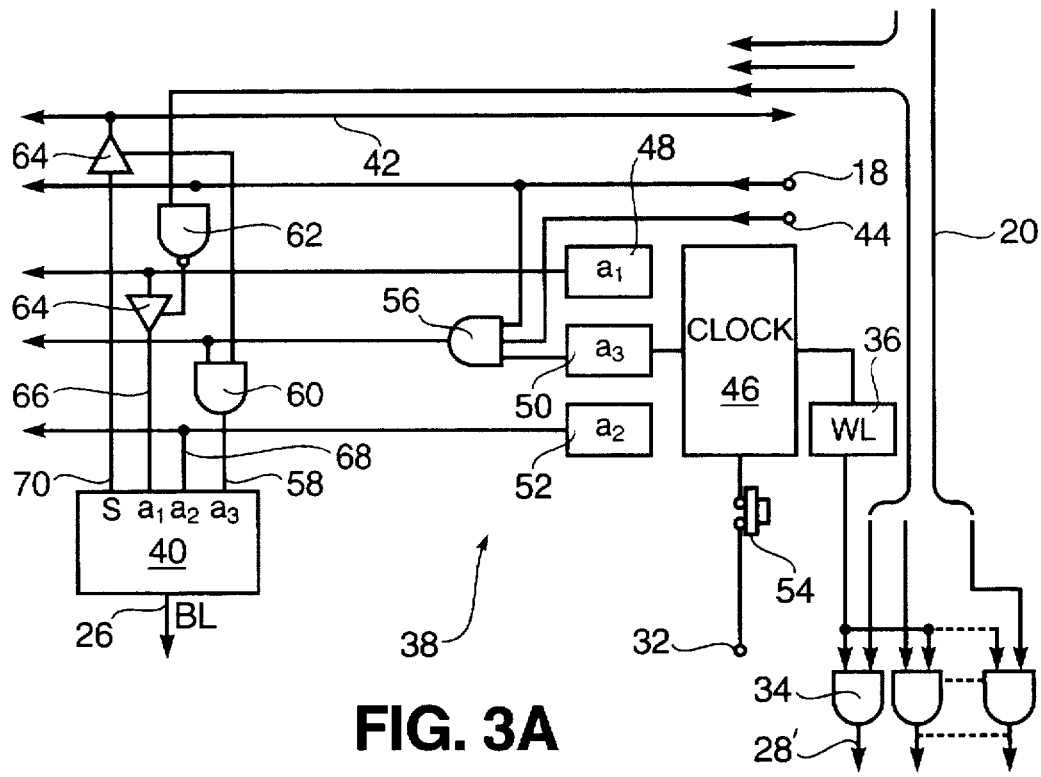
FIG. 3A is a more detail circuit diagram of the pulse sequence control section of the logic circuitry depicted in FIG. 2, in accordance with one embodiment of the invention.

The word lines 28 of the memory array receive digital address signals for each row of memory cells from the pulse sequence control section 38 of the logic circuitry 16 as shown in FIGS. 2 and 3A. AND gates 34 of the pulse sequence control section 38 as shown in FIG. 3A have one of their inputs respectively connected to data lines $20_1$, $20_2$, . . . , $20_n$; in bus 20 from the decoder 14. Second control inputs of the AND gates 34 are connected in parallel to a word line generator through which operational synchronizing commands are received from the pulse sequence control section 38 of the logic circuitry 16 to effect transfer of address data from the decoder 14 to the word lines 28 of the memory array.

With reference to FIGS. 1 and 2, binary data signals are respectively applied to columns of the memory cells 22 connected to the bit lines 26 of the memory array through sense amplifier reset sections 40 of the logic circuitry 16 to which outputs from the pulse sequence control section 38 are fed as diagrammed in FIG. 2. The data output from the logic circuitry 16 in external readout bus 42 extends from the pulse sequence control section 38 to which the input data is fed from decoder 14 through bus 20. Read/write data transfer signals from port 18 are also fed to the pulse sequence control section 38 as shown while a data input control signal is fed to the pulse sequence control section 38 from input port 44.

Referring again to FIG. 3A, the pulse sequence control section 38 of the logic circuitry 16 according to one embodiment of the invention includes a clock 46 from which three different clock signals are respectively fed to three pulse generators 48, 50 and 52 when the clock is selectively enabled through some switch 54 connected to the power supply. When the clock is enabled, clock signals are also fed to the word line pulse generator 36 to effect data transfer to the memory array as aforementioned. When signals are being fed from input data port 44 simultaneously with write pulse commands from read/write port 18 and timing pulses from generator 50, AND gate 56 is turned on to transfer a control pulse to one of the inputs of AND gates 60 having outputs respectively connected to terminals 58 of the sense amplifier sections 40. Decoded input data from one of the output lines of decoder bus 20 will then be transferred by the AND gates 60 to the terminals 58 of the sense amplifier sections 40. The decoded input data will also be transferred through NAND gates 62 under control of read commands from read/write port 18 fed to the NAND gates 62, as diagrammed in FIG. 3A. The output of each NAND gate 62 controllably enables a pulse amplifier 64 through which the output of pulse transmitter 48 is fed to each of the terminals 66 of the sense amplifier sections 40. The remaining input terminal 68 of each section 40 is directly connected to the output of pulse transmitter 52 as shown. Finally, an output terminal 70 of each section 40 is connected through an amplifier 72 to output data line of bus 42 when amplifier 72 is enabled by the decoded data pulse of decoder 14 in data bus 20 fed in parallel to AND gates 62 as aforementioned.

Figure 4:
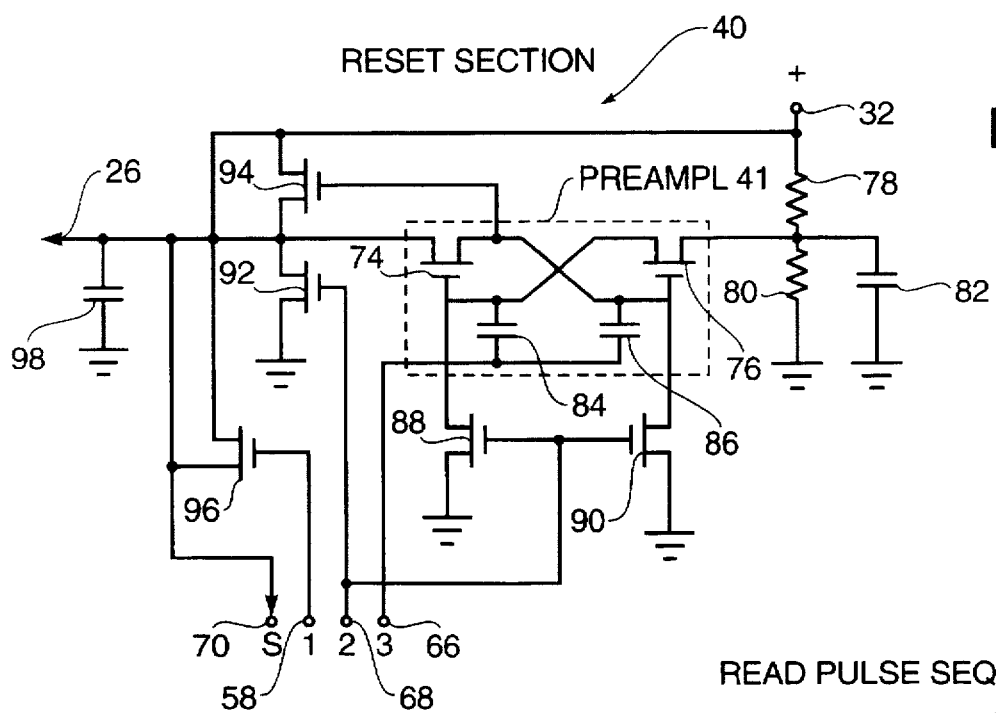
FIG. 4 is a circuit diagram of the sense amplifier section of the logic circuitry depicted in FIGS. 3, 3A and 3B.

Referring now to FIG. 4, one of the sense amplifier reset sections 40 is diagrammed in detail. The section 40 includes a preamplifier 41 having a pair of channel MOSFET transistors 74 and 76. The current carrying drain electrode of transistor 74 is connected to a bit line 26 while its control gate electrode is cross-coupled with the current carrying source electrode of transistor 76. The gate of transistor 76 is, on the other hand, cross-coupled with the source of transistor 74 while its drain is connected to the junction between voltage dividing load resistor 78 and grounded resistor 80 to which grounded reference capacitor 82 is also connected. The gates of transistors 74 and 76 are also respectively connected to phase control capacitors 84 and 86 which are in turn connected in parallel through timing control terminal 66 to the pulse sequence control section 38.

In accordance with the present invention, the sense amplifier section 40 additionally includes a pair of MOSFET transistors 88 and 90 having interconnected gates connected to timing terminal 68 and grounded drains. The source electrodes of transistors 88 and 90 are respectively connected to the gates of the transistors 74 and 76 of preamplifier 41. The terminal 68 is also connected to the gate of a transistor 92 having a grounded source and a drain connected to a bit line 26. A MOSFET transistor 94 interconnects the bit line with the power supply 32 in parallel with load resistor 78 and the drain of a transistor 96 to which a bit line 26 is also connected. The gates of transistor 92 and 96 are respectively connected to terminals 68 and 58 while the gate of transistor 94 is connected to the source of transistor 74 of the preamplifier 41. The sources of transistors 94 and 96 are both connected to the power supply 32 while the drain of transistor 96 is connected to the bit line 26 to which data output terminal 70 is coupled as shown in FIG. 4.

Each bit line 26 of the memory array 10 contains parasitic capacitance, as represented by capacitor 98 in FIG. 4, and high resistance to ground without any precharge being applied thereto disturbing its data storing condition. Initially, with the bit lines in their data storing condition, all gates of the transistors in the section 40 are at ground as well as their sources and drains except those of transistors 94 and 96 directly connected to the power supply 32. When a "zero" code readout operation is to be performed, a word line 28 is made high through one of the AND gates 34 as reflected by pulse 100 in FIG. 5 in response to an input from decoder 14 enabling clock 46 during an initial phase 101 of the "zero" readout operation. The transistors 24 in an aligned row of memory cells 22 to which such word line 28 is connected for sensing of their bit lines, are thereby turned on through their gates. The ferroelectric capacitors 30 in such row of activated memory cells 22 are accordingly coupled by their turned on transistors 24 to the bit lines 26 to be sensed, dumping small charges on those of the sensed bit lines storing "zero" data to cause their voltage levels to rise to 0.05 volts, for example. On the other hand, those of the sensed bit lines storing "one" data at a high voltage level are charged to 0.25 volts, for example. During the "zero" readout operation, the reference capacitor 82 is held at 0.15 volts, for example, by the voltage dividing resistors 78 and 80.

Figure 5:
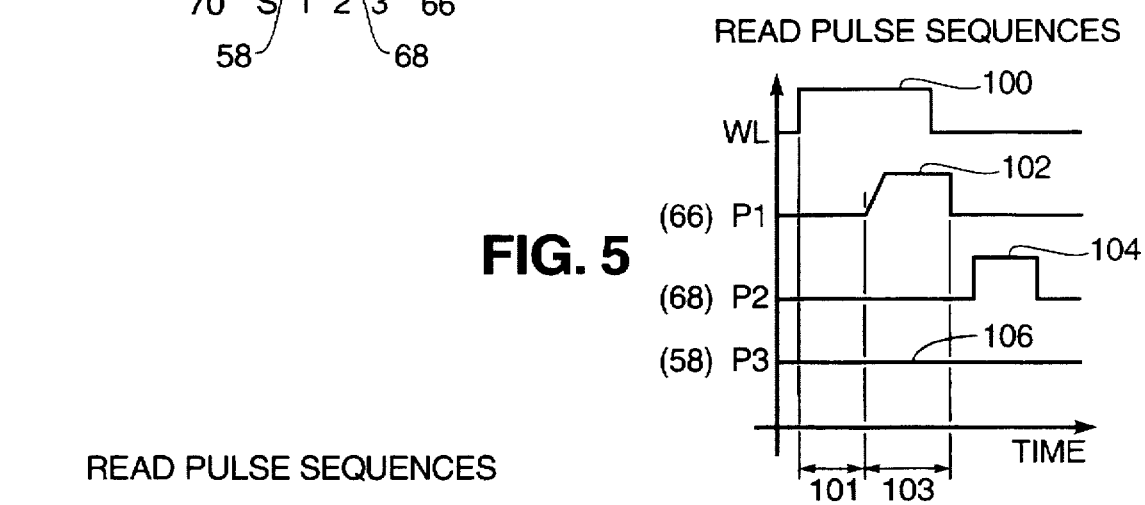
FIGS. 5 and 6 are graphical timing diagrams respectively depicting the read and write pulse sequences established by pulse sequence control sections depicted in FIGS. 2, 3A and 3B.

The next phase 103 of the readout operation as denoted in FIG. 5 occurs when input terminal 66 of the reset section 40 is ramped high by a pulse 102 in the pulse sequence graphically shown. If the source of transistor 74 connected to bit line 26 is at a lower potential than that on the source of transistor 76 connected to reference capacitor 82, preamplifier 41 detects such "zero" storage data. The potentials at the drains of transistors 74 and 76 then rise in response to the pulse 102 applied to the phase control capacitors 84 and 86 initially causing transistor 74 to conduct because of an associated gate to source voltage ratio higher than that of transistor 76. The charge on capacitor 86, which is small compared to parasitic capacitance 98, is thereby drained to maintain its charge level close to 0.05 watts and prevent switch-on of transistors 76 and 94 through their gates connected to capacitor 86. Meanwhile, the potential applied by capacitor 84 rises to insure turn on of transistor 74 through its gate. When the gate of transistor 74 approaches the supply voltage level, the potential on bit line 26 remains close to 0.05 volts which is low enough to enable writing of a "zero" data voltage level on those of the ferroelectric capacitors 30 of the memory cells 22 connected to the word lines 28 under the high voltage level of the pulse 100. Detection of the "zero" data is thereby reinforced until the highs on such word lines is removed at the end of the duration of pulse 102 applied to terminal 66. The potentials established on parasitic capacitor 98 and phase control capacitors 84 and 86 remain until such capacitors are grounded in response to a high potential applied by a reset pulse 104 as depicted in FIG. 5, applied to terminal 68 to turn on transistors 88, 90 and 92 through their gates in accordance with the present invention. Transistors 88, 90 and 92 remain on for the duration of the reset pulse 104, at the end of which they are turned off to restore the sense amplifier section 40 to its original data storing condition. Through the foregoing read out operation, the terminal 58 remained low as denoted by the low voltage level line 106 in FIG. 5 depicting the pulse sequence established through the pulse sequence control section 38 as hereinbefore described with respect to FIG. 3A. Accordingly, the transistor 96 remains turned off in view of the low level condition of terminal 58. The zero state of bit line 26 is therefore readout as a low voltage potential at terminal 70 connected to the drain of turned off transistor 96.

In order to effect readout of data "one" from the memory array 10, a word line 28 is raised to its high voltage level by a pulse 102 during the initial signal developing phase 101, as aforementioned, causing a bit line 26 to be charged to a 0.25 volt level which is higher than the potential on reference capacitor 82 at 0.15 volts. When the terminal 66 of section 40 goes high to initiate pulse 102 and the charge transfer phase 103, transistor 76 is turned on by an increase in the charge on capacitor 86 to drain the charge on capacitor 84 and maintain the gate of transistor 74 at a low potential preventing its turn on. Meanwhile, as the rising charge on capacitor 86 approaches five volts, transistor 94 is turned on causing bit line 26 to go high and restore the ferroelectric capacitors 30 of the memory cells, connected to such bit line, to the "one" state. In its high level state, the bit line also applies a latch setting signal to terminal 70 of the section 40.

During the period following phase 103 of the code "one" readout operation, the word line 28 is brought low to terminate pulse 102 while the capacitors 84 and 86 are grounded by transistor 88 and 90 in response to a high voltage applied to terminal 68 by the reset pulse 104. The "one" readout operation is then terminated at the end of reset pulse 104 as hereinbefore described with respect to the "zero" readout operation wherein terminal 58 remains low at the voltage level 106.

Figure 6:
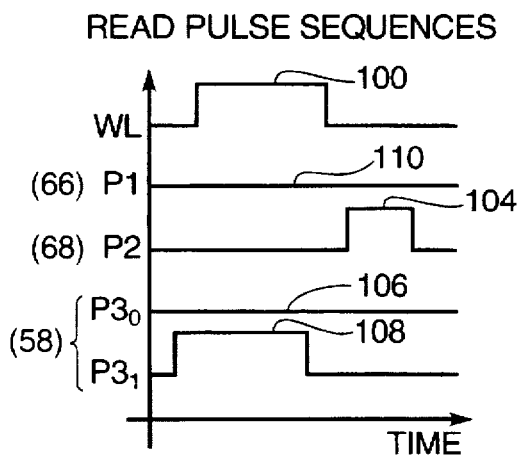

Writing a "zero" into the memory array is also initiated by the same word line pulse 100 applied to a word line 28 in a somewhat different pulse sequence as depicted in FIG. 6. The ferroelectric capacitors 30 of the memory cells 22 in the "zero" state are thereby slightly discharged. Those ferroelectric capacitors 30 in the "one" state are switched to the "zero" state by an increased discharge dumping action, since their bit line 26 is near ground, by blocking any pulse input to terminal 66 which is thereby held at a low voltage level 108 as depicted in FIG. 6 during the writing operation. After the word line 28 goes low, the same reset pulse 104 is applied to terminal 68 as hereinbefore described to complete the writing operation. Blocking of pulses to terminal 66 is limited by the pulse sequence control section 38 to those sections 40 from which bit lines 26 extend to those columns of memory cells involved in the writing operation. Also, terminal 58 of the section 40 is maintained at the low voltage level 106 for the "zero" writing operation.

In regard to the writing "one" operation, the terminal 58 of section 40 is initially raised to the high voltage level of a pulse 108 as depicted in FIG. 6 in order to turn on a transistor 96 as shown in FIG. 4. The bit line 26 is thereby also raised to the high potential level. When the word line goes high shortly thereafter as pulse 100 is applied, as shown in FIG. 6, ferroelectric capacitors 30 are connected to the bit line by turn on of the transistors 24 in the memory cells. If such capacitors 30 were already in the "one" state, a small charge is fed thereto for reinforcement purposes. Capacitors 30 in the "zero" state, on the other hand, are switched to the "one" state by the word line high established by pulse 100. Upon termination of pulse 100, pulse 108 is also terminated as diagrammed in FIG. 6 so that terminal 58 goes low after which reset pulse 104 is applied to terminal 68 to ground the bit line by turn on of transistor 92 thereby terminating the "one" writing operation. Terminal 66 remains at a low voltage level 110 as shown in FIG. 6 during the foregoing writing operating.

Figure 3B:
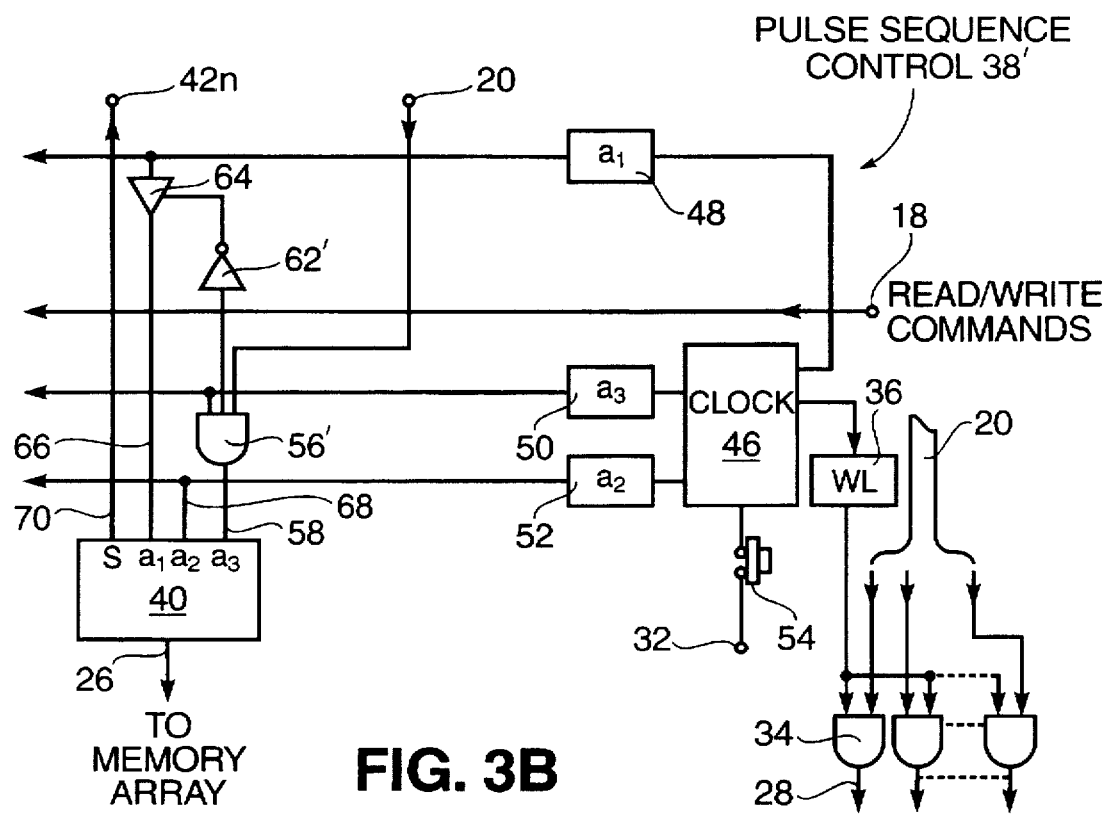
FIG. 3B is a circuit diagram of the pulse sequence control section in accordance with another embodiment of the invention.

FIG. 3B illustrates a somewhat different pulse sequence control section 38' of the logic circuitry through which the same four memory functions are performed, as hereinbefore described, in reading "zero", reading "one", writing "zero" and writing "one". The pulse sequence control section 38' includes the same clock operating the three pulse generators 48, 50 and 52 and a word line pulse generator 36 as hereinbefore described with respect to section 38. The same pulse sequences, as depicted in FIGS. 5 and 6, are produced by selectively blocking the pulses 102 and 108 while continuously transmitting the word line pulse 100 and the sequence reset pulse 104. Also, pulse generator 48 is directly connected in parallel to the inputs of all amplifiers 64 respectively connected to the input terminals 66 of the sense amplifier sections 40 while pulse generator 52 is directly connected in parallel to all of the input terminals 68. The pulse generator 50 is connected to one input of an AND gate 56' also having an input to which read or write signals are applied from port 18 and a data signal input from the output data bus 20. The output of AND gate 56' is directly applied to terminal 58 of the sense amplifier section 40 as shown in FIG. 3B. Thus, pulses 102 are blocked by the high level write signals applied to AND gate 56' during write pulse sequences through the action of signal reversing gate 62' on amplifier 64, while the low level read signals from port 18 render AND gate 56' non-conductive to prevent any data pulses 108 from being applied to terminal 58 during the read pulse sequences.

Numerous other modifications and variations of the present invention are possible in light of the foregoing teachings. It is therefore to be understood that within the scope of the appended claims the invention may be practiced otherwise than as specifically described.

What is claimed is:

1. A programmable semiconductor memory apparatus: comprising an array of memory cells; a plurality of bit lines connected to said memory cells of the array; a bus; logic means operatively connecting said bus to a selected one of the memory cells through one of the bit lines including a data sense circuit connected to said bus for reading data from said memory cell array; and storing means coupled to the bus for enabling readout externally of the memory apparatus, said data sense circuit including a preamplifier through which a data storing condition within said array of memory cells is detected in response to address by a word line pulse causing transfer of charges and logic controlled reset means connected to the preamplifier for restoring said data storing condition in the array of memory cells following said transfer of the charges.

2. The apparatus as defined in claim 1 including clock controlled means generating charge transfer pulses for producing the charges transferred within the preamplifier during operation thereof, the logic controlled reset means including means generating a reset pulse applied to the preamplifier in timed relation to the change transfer pulses for terminating said operation of the preamplifier.

3. The apparatus as defined in claim 1 wherein said logic controlled reset means includes means directly coupling one of the bit lines to the preamplifier, a reference charge source directly coupled to the preamplifier, pulse controlled switch means connected to said source for limiting operation of the preamplifier to data transfer periods during which said transfer of the charges occurs and means generating reset pulses in timed relation to said data transfer periods for enabling said restoring of the memory cells to the nonvolatile condition thereof following the data transfer periods.

4. A programmable semiconductor memory apparatus: comprising an array of memory cells; a plurality of bit lines connected to said memory cells of the array; a bus; logic means operatively connecting said bus to a selected one of the memory cells through one of the bit lines including a data sense circuit connected to said bus for reading data from said memory cell array; and storing means coupled to the bus for enabling readout externally of the memory apparatus, each of said memory cells including a ferroelectric capacitor and switching means for electrically interconnecting the capacitor and said one of the bit lines in response to selective address, means for applying voltage to the capacitor in each of the cells and said data sense circuit including reset means for restoring the bit lines to a data storing condition between data transfer operations.

5. A programmable semiconductor memory apparatus: comprising an array of memory cells; a plurality of bit lines connected to said memory cells of the array; a bus; logic means operatively connecting said bus to a selected one of the memory cells through one of the bit lines including a data sense circuit connected to said bus for reading data from said memory cell array; and storing means coupled to the bus for enabling readout externally of the memory apparatus, each of the bit lines having a parasitic capacitive reactance, said data sense circuit including sense means connected to the bit lines for detection of changes in voltage level therein during data transfer operations and reset means for restoring the memory cells to the data storing condition thereof prior to said detection of changes in the voltage level by the sense means.

6. The combination of claim 5 wherein said sense means includes a preamplifier and said restoring means includes. logic gate means connected to the preamplifier for rendering the reset means operative upon completion of the data transfer operations.

* * * * *